United States Patent
Nakano et al.

(10) Patent No.: US 7,388,255 B2
(45) Date of Patent: Jun. 17, 2008

(54) SEMICONDUCTOR DEVICE HAVING SEPARATION REGION

(75) Inventors: Takashi Nakano, Nukata-gun (JP); Shigeki Takahashi, Okazaki (JP)

(73) Assignee: DENSO CORPORATION, Kariya (JP)

( * ) Notice: Subject to any disclaimer, the term of this patent is extended or adjusted under 35 U.S.C. 154(b) by 8 days.

(21) Appl. No.: 11/598,650

(22) Filed: Nov. 14, 2006

(65) Prior Publication Data

US 2007/0108469 A1    May 17, 2007

(30) Foreign Application Priority Data

Nov. 14, 2005   (JP)   ............... 2005-329334

(51) Int. Cl.
 *H01L 29/76* (2006.01)
(52) U.S. Cl. ............ 257/330; 257/341; 257/343; 257/141; 257/162; 257/E21.382; 257/E21.384; 257/E21.628; 257/E29.027
(58) Field of Classification Search ........ 257/330, 257/341, 343, 141, 162, E21.382, E21.384, 257/E21.628, E29.027
See application file for complete search history.

(56) References Cited

U.S. PATENT DOCUMENTS

| | | | |
|---|---|---|---|
| 5,640,034 A | 6/1997 | Malhi | |
| 5,723,891 A | 3/1998 | Malhi | |
| 5,796,125 A * | 8/1998 | Matsudai et al. | ........... 257/141 |
| 6,118,149 A * | 9/2000 | Nakagawa et al. | ......... 257/330 |
| 6,242,787 B1 | 6/2001 | Nakayama et al. | |
| 6,452,231 B1 | 9/2002 | Nakagawa et al. | |
| 6,831,331 B2 | 12/2004 | Kitamura et al. | |
| 2002/0060341 A1 | 5/2002 | Terashima | |

FOREIGN PATENT DOCUMENTS

| | | |
|---|---|---|
| EP | 1 487 023 A2 | 12/2004 |
| JP | A-10-150207 | 6/1998 |
| WO | WO 2004/042826 A2 | 5/2004 |

OTHER PUBLICATIONS

Office Communication issued from German Patent Office dated Feb. 25, 2008 for related German application No. 10 2006 053 145.0-33 (a copy of English translation enclosed.).

* cited by examiner

*Primary Examiner*—Andy Huynh
(74) *Attorney, Agent, or Firm*—Posz Law Group, PLC

(57) ABSTRACT

A semiconductor device includes: a semiconductor substrate; a separation region in the substrate; an embedded layer; a channel forming region; a source region; a drain region; a first electrode for the source region; a second electrode for the channel forming region; a third electrode for the drain region; a trench penetrating the channel forming region between the source region and the drain region; a trench gate electrode in the trench; an offset layer on a portion to be a current path provided by the trench gate electrode; and an electric field relaxation layer under the channel forming region and the offset layer connected to the channel forming region and covering a bottom of the trench.

13 Claims, 9 Drawing Sheets

SEMICONDUCTOR DEVICE HAVING SEPARATION REGION

CROSS REFERENCE TO RELATED APPLICATION

This application is based on Japanese Patent Application No. 2005-329334 filed on Nov. 14, 2005, the disclosure of which is incorporated herein by reference.

FIELD OF THE INVENTION

The present invention relates to a semiconductor device having a separation region.

BACKGROUND OF THE INVENTION

A trench gate type lateral MOSFET is well known and disclosed in, for example, U.S. Pat. No. 5,723,891 and U.S. Pat. No. 5,640,034. This MOSFET is capable of reducing an on-state resistance by increasing a channel density with a trench gate electrode.

However, in case of a complex IC, a $N^+$ type embedded layer is disposed in a bipolar transistor forming region. As shown in FIG. 11, when the trench gate type lateral MOSFET is formed in a substrate, the $N^+$ type embedded layer 100 provides a drain electric potential. Thus, an electric field is concentrated at a corner of a bottom of a trench gate electrode 108, so that a breakdown voltage is reduced.

A detailed description is explained. In FIG. 11, a silicon island in a N type silicon layer 101 is separated by a trench 102 and an embedded oxide film 103. In the silicon island, a channel forming region 104, a $N^+$ source region 105, a $P^+$ type contact well layer 106, a $N^+$ type drain region 107 and a trench gate electrode 108 are formed. In the silicon island, a $N^+$ type embedded layer 100 is formed on a bottom of the N type silicon layer 101. Here, when the silicon island includes the $N^+$ type embedded layer 100, in a case where a voltage is applied to the $N^+$ type drain region 107, the electric potential of the $N^+$ type embedded layer 100 is also increased in accordance with the drain potential. As a result, the electric field is concentrated at a lower portion of the trench gate electrode 108 disposed on a drain region 107 side (i.e., an XIA portion in FIG. 11), so that the breakdown voltage is reduced. Further, for example, when the $N^+$ embedded layer 100 provides the source electric potential, the electric field is concentrated at an edge of the trench gate electrode 108 (i.e., a corner of the bottom), so that the breakdown voltage is reduced.

SUMMARY OF THE INVENTION

In view of the above-described problem, it is an object of the present disclosure to provide a semiconductor device having a separation region.

According to an aspect of the present disclosure, a semiconductor device includes: a semiconductor substrate; a separation region disposed in the substrate, wherein the separation region is separated from other parts of the substrate; an embedded layer having a first conductive type, wherein the embedded layer is disposed on a bottom portion of the separation region, and wherein the embedded layer has an electric potential in a floating state; a channel forming region having a second conductive type, wherein the channel forming region is disposed on a surface portion of the separation region on a principal surface of the semiconductor substrate; a source region having the first conductive type, wherein the source region is disposed on a surface portion of the channel forming region; a drain region having the first conductive type, wherein the drain region is disposed on another surface portion of the separation region on the principal surface of the substrate, and wherein the drain region is separated from the channel forming region; a first electrode for applying a source voltage to the source region; a second electrode for applying the source voltage to the channel forming region; a third electrode for applying a drain voltage to the drain region; a trench disposed on the principal surface of the semiconductor substrate, wherein the trench penetrates the channel forming region between the source region and the drain region, and wherein the trench is deeper than the channel forming region; a trench gate electrode disposed on an inner surface of the trench through a gate insulation film; an offset layer having the first conductive type, wherein the offset layer is disposed on a portion of the separation region to be a current path provided by the trench gate electrode between the channel forming region and the drain region, and wherein the portion is further another surface portion of the separation region on the principal surface of the substrate; and an electric field relaxation layer having the second conductive type, wherein the electric field relaxation layer is disposed under the channel forming region and the offset layer in the separation region, and wherein the electric field relaxation layer is deeper than the trench, is connected to the channel forming region, and covers a bottom of the trench.

In the above device, when a transistor turns on, an inversion layer is formed on a portion facing the trench gate electrode, the portion disposed in the channel forming region. Thus, a current flows between the drain region and the source region through the portion (i.e., the inversion layer) in the channel forming region facing the trench gate electrode and the offset layer. On the other hand, an electric field relaxation well layer is formed under the channel forming region and the offset layer. The electric field relaxation well layer is connected to the channel forming region. Further, the electric field relaxation well layer covers the bottom of the trench. Thus, the electric field is not concentrated at the lower portion of the trench gate electrode disposed on a drain region side, so that the breakdown voltage is improved. Further, since the electric potential of the embedded layer becomes in a floating state, both of the breakdown voltage and the static electricity withstand voltage are balanced. Thus, the semiconductor device having the trench gate type lateral MOS transistor construction, in which the embedded layer is disposed in the region separated from other parts, has excellent breakdown voltage.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1:
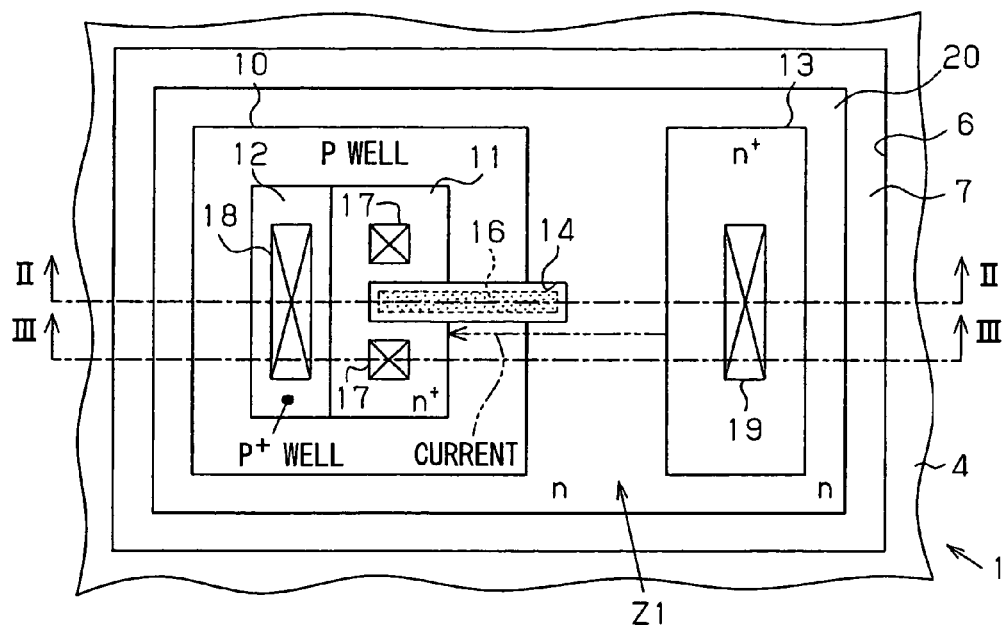
FIG. 1 is a plan view showing a semiconductor device according to a first embodiment mode.
Figure 2:
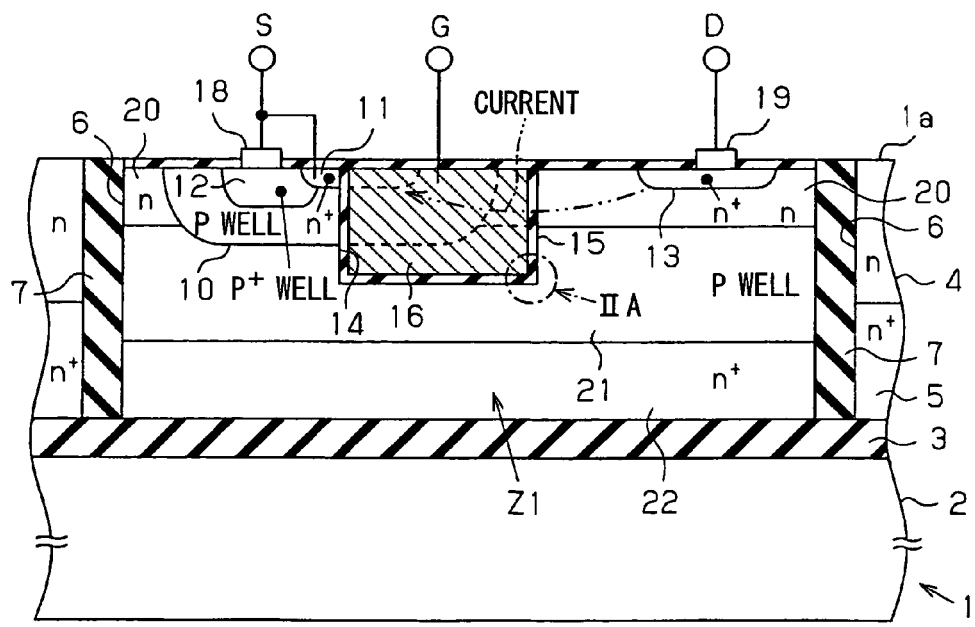
FIG. 2 is a vertical cross sectional view showing the device taken along line II-II in FIG. 1.
Figure 3:
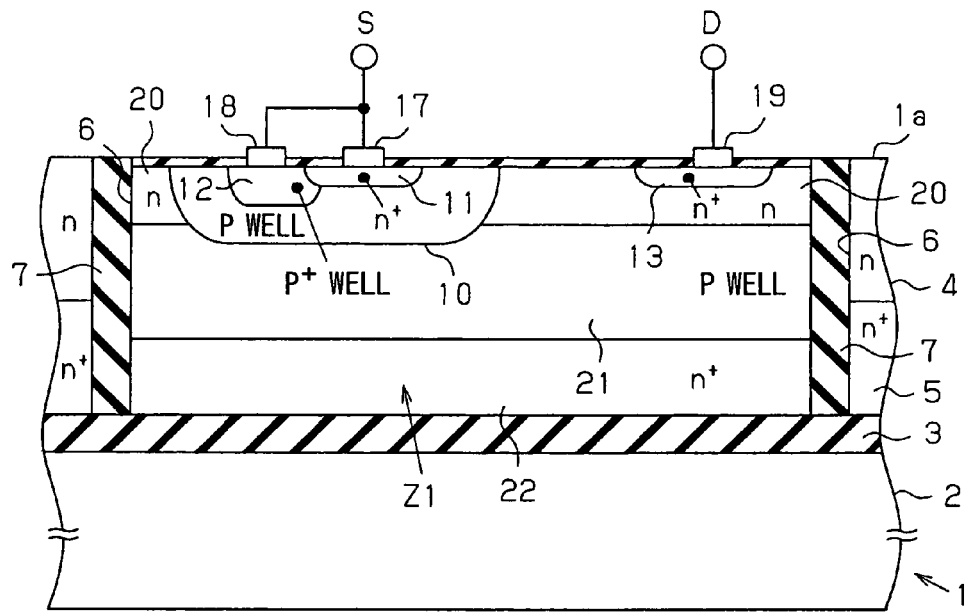
FIG. 3 is a vertical cross sectional view showing the device taken along line III-III in FIG. 1.

FIG. 1 is a plan view showing a semiconductor device according to a first embodiment mode. FIG. 2 is a cross sectional view showing the device taken along line II-II in FIG. 1. FIG. 3 is a cross sectional view showing the device taken along line III-III in FIG. 1. The semiconductor device is a complex IC so that a bipolar transistor and a MOS transistor are formed in one chip. The MOS transistor has a trench gate type lateral MOS transistor construction. Further, the MOS transistor is a N channel transistor.

In FIGS. 2 and 3, the semiconductor substrate 1 is formed such that the silicon layer 4 having the N type (e.g., the first conductive type) is formed on the silicon substrate 2 through the embedded oxide film 3. The $N^+$ type embedded layer 5 is formed on the bottom of the N type silicon layer 4. The upper surface of the semiconductor substrate 1 is a principal surface 1$a$.

The part separation trench 6 is formed in the silicon layer 4. The trench 6 reaches the embedded oxide film 3. As shown in FIG. 1, the part separation trench 6 is formed to have a square shape. An insulation film 7 is filled in the part separation trench 6. Thus, the lateral type MOS transistor island is separated from surrounding parts by the trench 6. Thus, the region (i.e., the lateral type MOS transistor forming region) Z1 is formed in the semiconductor substrate 1 to separate from other parts by the trench 6.

Similarly, in a bipolar transistor forming region (i.e., island), which is separated from other parts by a trench, a bipolar transistor (not shown) is formed. Further, the $N^+$ type embedded layer 5 is formed in the bipolar transistor forming region (i.e., island).

A channel forming region (i.e., a P type well layer) 10 having a P conductive type (e.g., the second conductive type) is formed on the surface portion of the principal surface 1$a$ of the semiconductor substrate 1 in the region (i.e., the lateral type MOS transistor forming region) Z1, which is separated from other parts. Further, a $N^+$ type source region (e.g., the source region having the first conductive type) 11 is formed on the surface portion of the principal surface 1$a$ in the channel forming region 10. Furthermore, a $P^+$ type source contact region (i.e., $P^+$ type well layer) 12 is formed on the surface portion in the channel forming region 10, and adjacent to the $N^+$ type source region 11.

A $N^+$ type drain region (e.g., the drain region having the first conductive type) 13 is formed on the surface portion of the principal surface 1$a$ in the region Z1 separated from other parts. The $N^+$ type drain region 13 is separately disposed from the P type channel forming region 10.

A trench 14 is formed from the principal surface 1$a$ in the region Z1 separated from other parts. The trench 14 has a planar construction such that the trench 14 penetrates the P type channel forming region 10 between the $N^+$ type source region 11 and the $N^+$ type drain region 13 in a direction from the $N^+$ type source region 11 to the $N^+$ type drain region 13. The trench 14 has a vertical cross sectional construction such that the trench 14 is formed to be deeper than the channel forming region 10. A trench gate electrode 16 is formed on the inner wall of the trench through the gate oxide film 15 as a gate insulation film.

A source electrode 17, an electrode 18 for the channel forming region, and a drain electrode 19 are disposed on the silicon layer 4. The source electrode 17 is electrically connected to the $N^+$ type source region 11. The electrode 18 for the channel forming region is electrically connected to the $P^+$ type source contact region (i.e., the $P^+$ type well layer) 12. The source voltage is applied to the source region 11 and the channel forming region 10 through these electrodes 17, 18. On the other hand, the drain electrode 19 is electrically connected to the drain region 13. The drain voltage is applied to the drain region 13 through the electrode 19.

An offset layer 20 having the N conductive type (e.g., the first conductive type) is formed on the surface portion of the principal surface 1$a$ in the region Z1 separated from other parts. The offset layer 20 is formed in whole area around the channel forming region 10 and the $N^+$ type drain region 13. Thus, the offset layer 20 is also formed in a portion, which is to be a current path provided by the trench gate electrode 16 between the channel forming region 10 and the drain region 13. The offset layer 20 is deeper than the $N^+$ drain region 13, and further, is shallower than the channel forming region 10.

An electric field relaxation well layer 21 having the P conductive type (e.g., the second conductive type) is formed under the channel forming region 10 and the offset layer 20 in the region Z1 separated from other parts. The well layer 21 is deeper than the trench 14, is connected to the channel forming region 10, and covers the bottom of the trench 14. Specifically, the P type well layer 21 is formed under the bottom of the trench gate electrode 16, and the N type offset layer 20 and the P type electric field relaxation well layer 21 are doubly diffused so that a Re-surf construction is provided. In FIGS. 2 and 3, in the region (i.e., the lateral type MOS transistor forming region) Z1 separated from other parts, a $N^+$ type embedded layer (e.g., the embedded layer having the first conductive type) 22 is formed on the bottom of the region Z1 in such a manner that the $N^+$ type embedded layer 22 contacts the electric field relaxation well layer 21. The $N^+$ type embedded layer 22 has an electric potential in a floating state.

Next, the operation of the semiconductor device having the above construction is explained.

When the lateral type power MOS transistor turns off (i.e., the drain potential is a predetermined positive potential, the gate potential is null volt, and the source potential is null volt), no current flows.

On the other hand, when the lateral power MOS transistor turns on (i.e., the drain potential is a predetermined positive potential, the gate potential is a predetermined positive potential, and the source potential is null volt), an inversion layer is formed on a portion in the P type channel forming region 10, the portion facing the trench gate electrode 16. In a route shown as a two-dot chain line in FIGS. 1 and 2, the current flows between the N+ type drain region 13 and the N+ type source region 11 through the N type offset layer 20 and the portion (i.e., the inversion layer) in the P type channel forming region 10 facing the trench gate electrode 16. At this time, the current path is formed in a region to a deeper portion apart from the surface. Thus, the on-state resistance can be reduced.

Thus, the trench 14 crosses the P type channel forming region 10, and reaches the N type offset layer 20 through the N+ type source region 11. The positive potential is applied to the trench gate electrode 16 so that the inversion layer is formed on the side of the trench gate electrode 16. The current flows through the inversion layer. Thus, by using the trench gate electrode 16, the channel density per unit area with respect to the planar construction is improved, and the on-state resistance is reduced.

Figure 11:
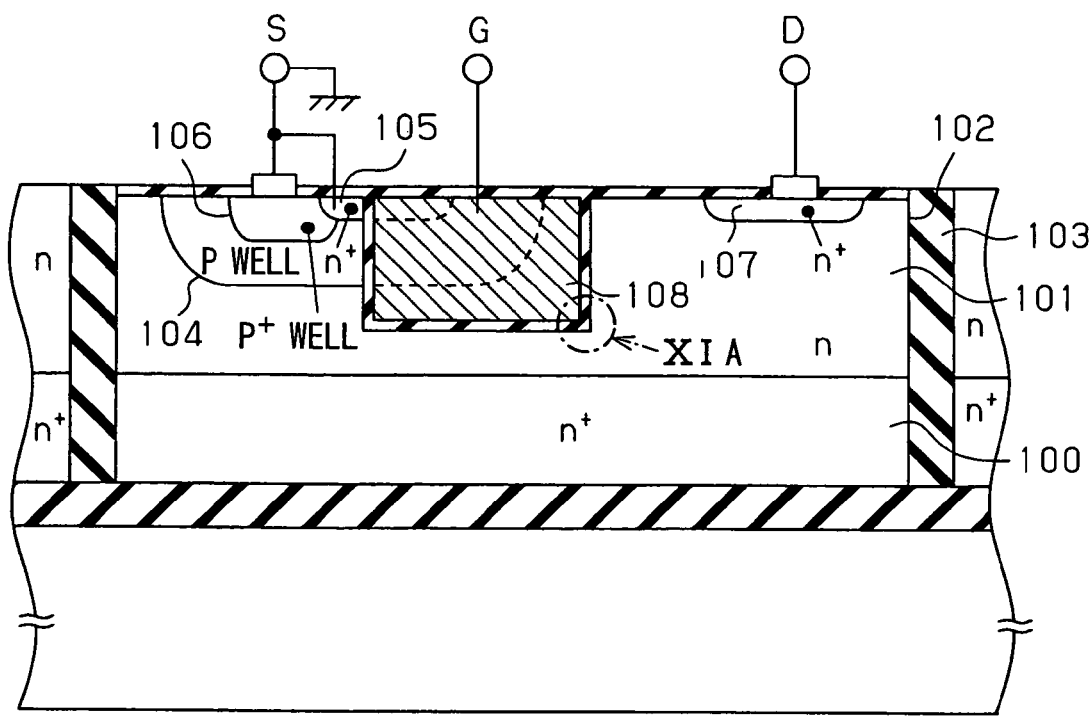
FIG. 11 is a vertical cross sectional view showing a semiconductor device according to a prior art.

Here, as shown in FIG. 11, when the device includes the N+ type embedded layer 100, the electric potential of the N+ embedded layer 100 is also increased in accordance with the drain potential in a case where the voltage is applied to the N+ type drain region 107. As a result, the electric field is concentrated at the lower portion (i.e., an XIA portion in FIG. 11) of the trench gate electrode 108 disposed on the drain region 107 side, so that the breakdown voltage is reduced. On the other hand, in the present embodiment shown in FIG. 2, the P type electric field relaxation well layer 21 connecting to the P type channel forming region 10 covers the bottom of the trench 14 (i.e., the trench gate electrode 16). Thus, when the electric potential is applied to the drain region 13, the electric field is not concentrated at the lower portion (i.e., an IIA portion in FIG. 2) of the trench gate electrode 16 disposed on the drain region 13 side, so that the breakdown voltage is improved.

Further, the N+ type embedded layer 22 is separated from surrounding parts by the trench 14, so that the N$^{30}$ type embedded layer 22 is in a floating state. Here, when the N+ type embedded layer 22 becomes the drain potential, the electric field is easily concentrated at the edge (i.e., the corner of the bottom) of the trench gate electrode 16, so that the breakdown voltage is reduced. Furthermore, when the N+ type embedded layer 22 becomes the source potential, a NPN transistor provided by the N type offset layer 20-P type electric field relaxation well layer 21-N+ type embedded layer 22 shown in FIG. 2 easily functions as a parasitic bipolar operation in a case where the static electricity is applied. Accordingly, the static electricity withstand voltage is reduced. On the other hand, when the N+ type embedded layer 22 is in a floating state, both of the breakdown voltage and the static electricity withstand voltage are balanced (i.e., the breakdown voltage is improved, and further, the static electricity withstand voltage is secured).

Thus, the semiconductor device having the trench gate type lateral MOS transistor construction, in which the embedded layer 22 is disposed in the region Z1 separated from other parts, has excellent breakdown voltage.

Further, since the region Z1 separated from other parts is formed in the semiconductor substrate 1 by using the part separation trench 6, the part separation is easily realized.

Figure 12:
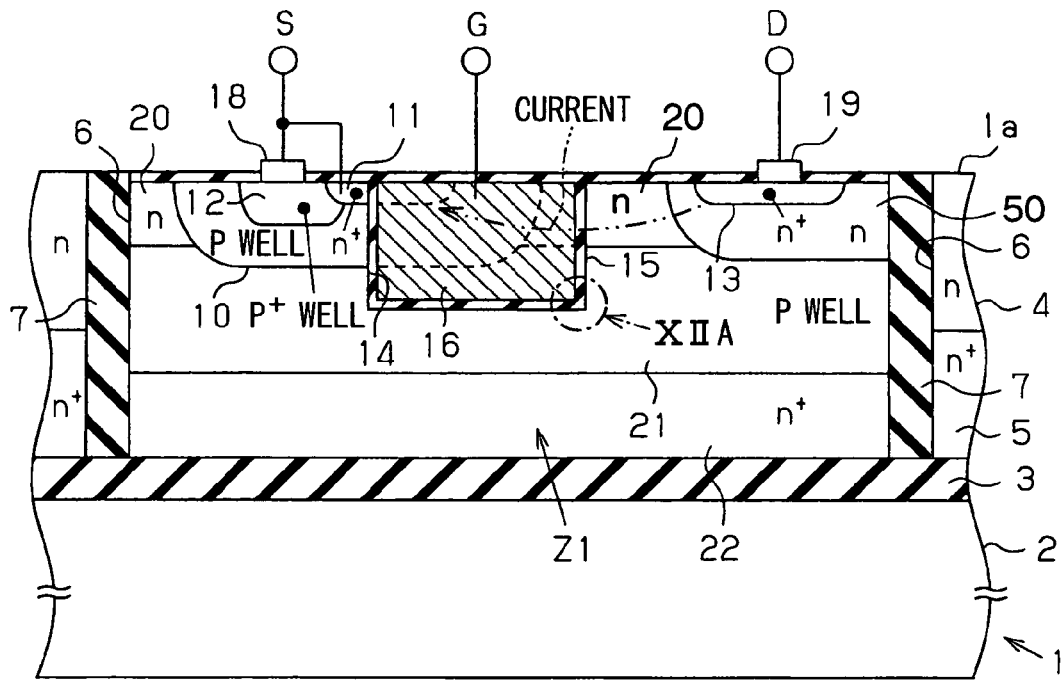
FIG. 12 is a vertical cross sectional view showing another semiconductor device according to a modification of the first embodiment mode.

Alternatively, as shown in FIG. 12, the device may have a N well 50. The N well 50 has an impurity concentration higher than the offset layer 20 and less than the drain region 13, and disposed around the drain region 13. In this case, when an ESD surge is applied to the device, the electric field concentration near the drain region 13 is reduced. Accordingly, the on-state breakdown voltage of the device, i.e., the ESD surge withstand voltage, is improved.

Further, the device may have another diffusion layer in a body region near the source. This diffusion layer has an impurity concentration higher than the body region. This diffusion layer improves (or reduces) operation of a parasitic bipolar transistor near the source. Thus, the surge withstand voltage such as the ESD surge withstand voltage is improved.

Second Embodiment Mode

Next, the difference between the first embodiment mode and the second embodiment mode is mainly explained.

Figure 4:
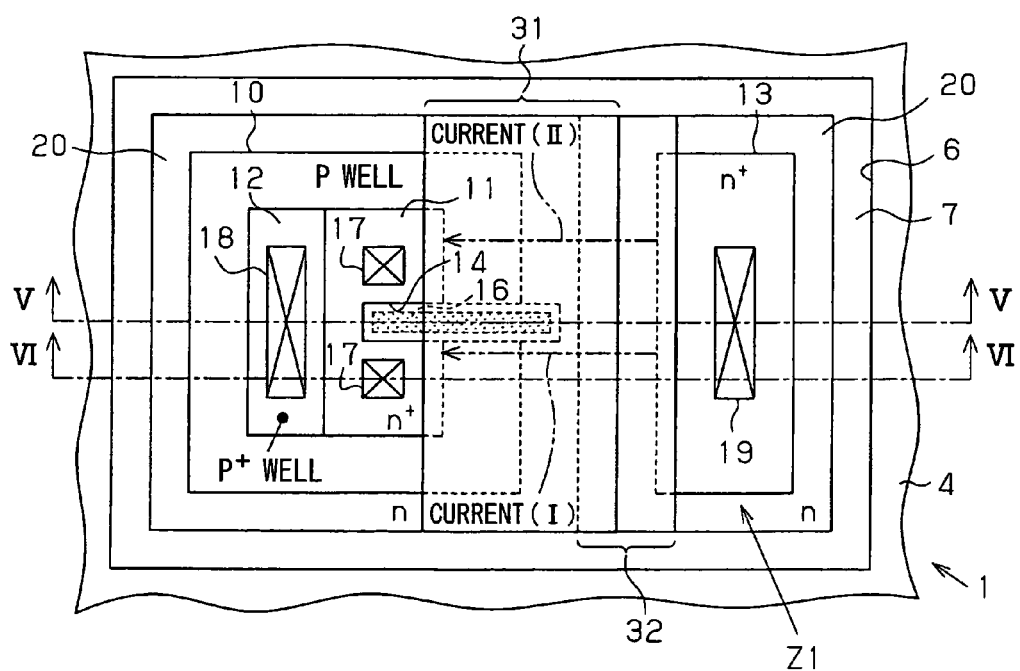
FIG. 4 is a plan view showing a semiconductor device according to a second embodiment mode.
Figure 5:
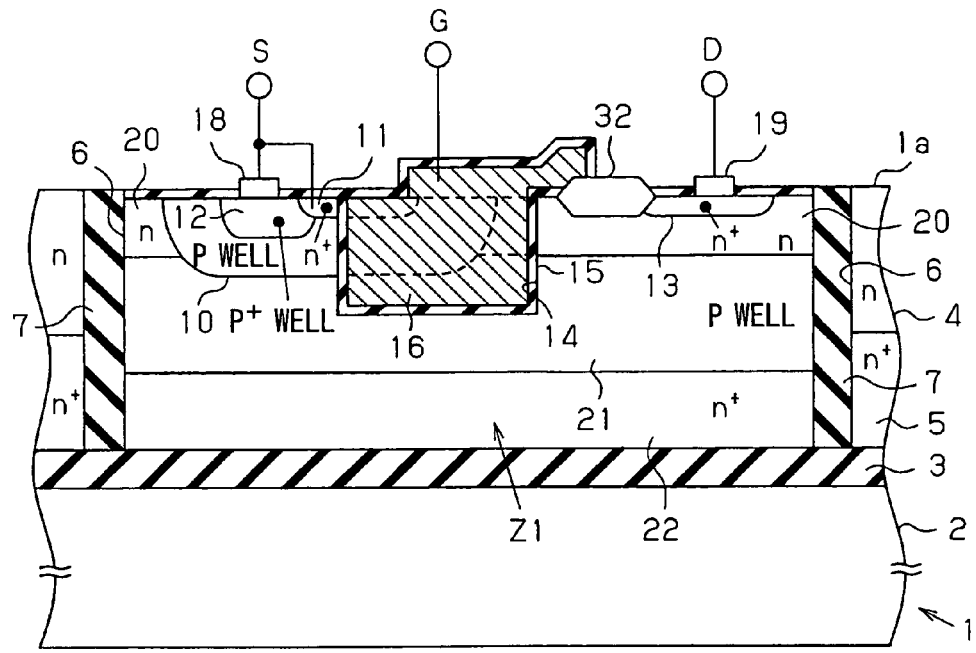
FIG. 5 is a vertical cross sectional view showing the device taken along line V-V in FIG. 4.
Figure 6:
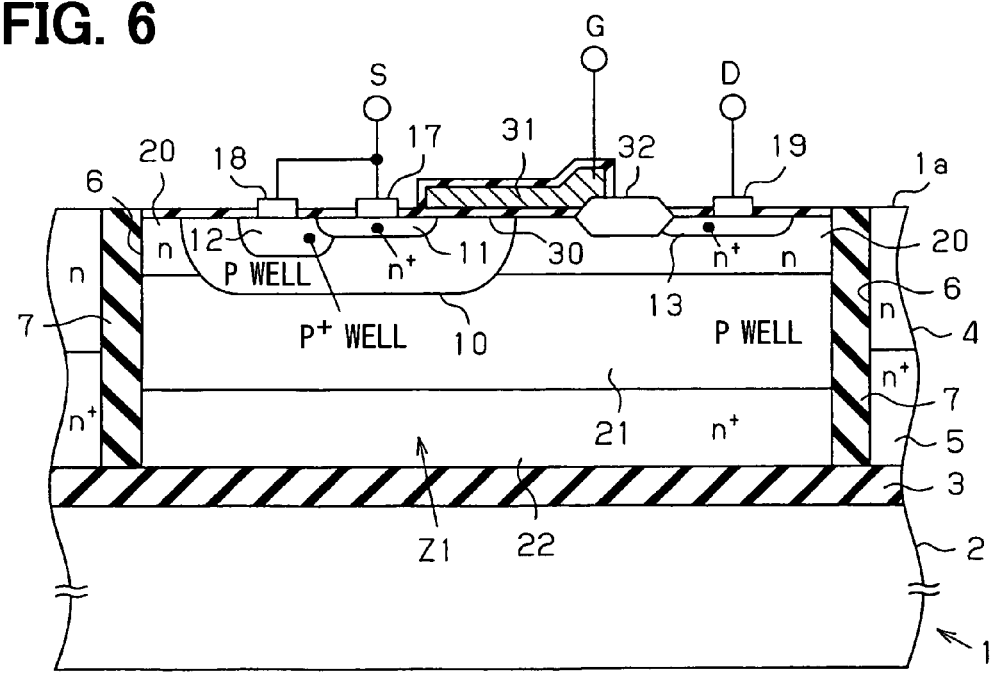
FIG. 6 is a vertical cross sectional view showing the device taken along line VI-VI in FIG. 4.

FIG. 4 is a plan view of a semiconductor device according to the present embodiment mode. FIG. 5 is a vertical cross sectional view of the device taken along line V-V in FIG. 4. FIG. 6 is a vertical cross sectional view of the device taken along line VI-VI in FIG. 4.

As shown in FIGS. 4, 5 and 6, the semiconductor device according to the present embodiment mode further includes the planar gate electrode 31 in addition to the trench gate electrode 16.

As shown in FIGS. 4 and 6, the planar gate electrode 31 is formed on the principal surface 1a through the gate oxide film 30 as the gate insulation film. The planar gate electrode 31 and the trench gate electrode 16 shown in FIG. 5 are integrated. Further, the LOCOS oxide film 32 is formed on the principal surface 1a between the N+ type drain region 13 and the channel forming region 10.

When the lateral type power MOS transistor turns on (i.e., the positive voltage is applied to the gate electrode), the inversion layer is formed on a portion of the P type channel forming region 10 facing the trench gate electrode 16 and a portion facing the planar gate electrode 31. In FIG. 4, the current flows along with a route shown as current I, i.e., the current flows between the N+ type drain region 13 and the N+ type source region 11 through the portion (i.e., the inversion layer) of the channel forming region 10 facing the trench gate electrode 16 and the N type offset layer 20. Further, in FIG. 4, the current flows through a route shown as current II, i.e., the current flows between the N+ type drain region 13 and the N+ type source region 11 through the portion (i.e., the inversion layer) of the channel forming region 10 facing the planar gate electrode 31 and the N type offset layer 20. Thus, the above transistor having the lateral type power device construction by using the trench gate electrode 16 and the planar gate electrode 31 has an on-state resistance lower than the trench gate type lateral power device.

The above embodiment mode has the following effects.

(b1) Since the planar gate electrode 31 is further formed on the principal surface 1a through the gate oxide film 30 as the gate insulation film, the on-state resistance is reduced.

(b2) Since the LOCOS oxide film 32 is further formed on the portion to be a current path provided by the planar gate electrode 31, the portion disposed on the principal surface 1a of the semiconductor substrate 1 in the region Z1 separated from other parts, the breakdown voltage is improved.

Figure 13:
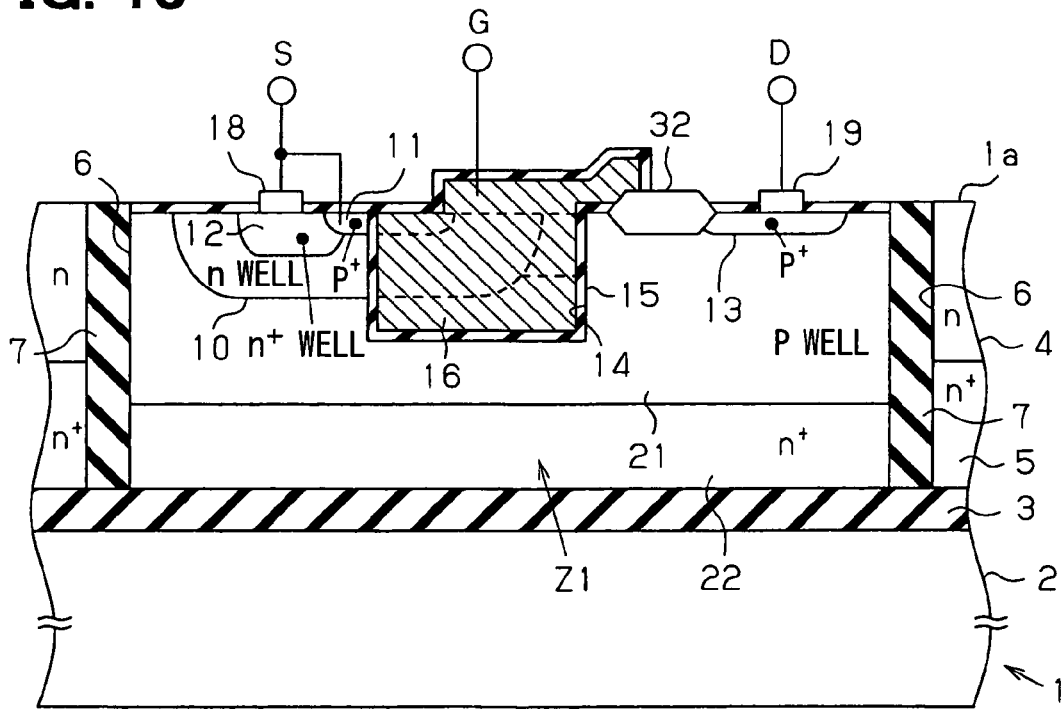
FIG. 13 is a vertical cross sectional view showing another semiconductor device according to a modification of the second embodiment mode.

Alternatively, as shown in FIG. 13, the device may not have the offset layer 20. Specifically, in the device, the corner of the trench gate electrode 16 is disposed in the electric field relaxation well layer 21, which has the P conductive type. The electric field relaxation well layer 21 is electrically connected to the channel forming region 10. Accordingly, the drain potential does not penetrate under the trench gate electrode 16. As a result, the electric field at the corner of the trench gate electrode 16 is reduced, and therefore, the breakdown voltage of the device is improved.

Figure 14:
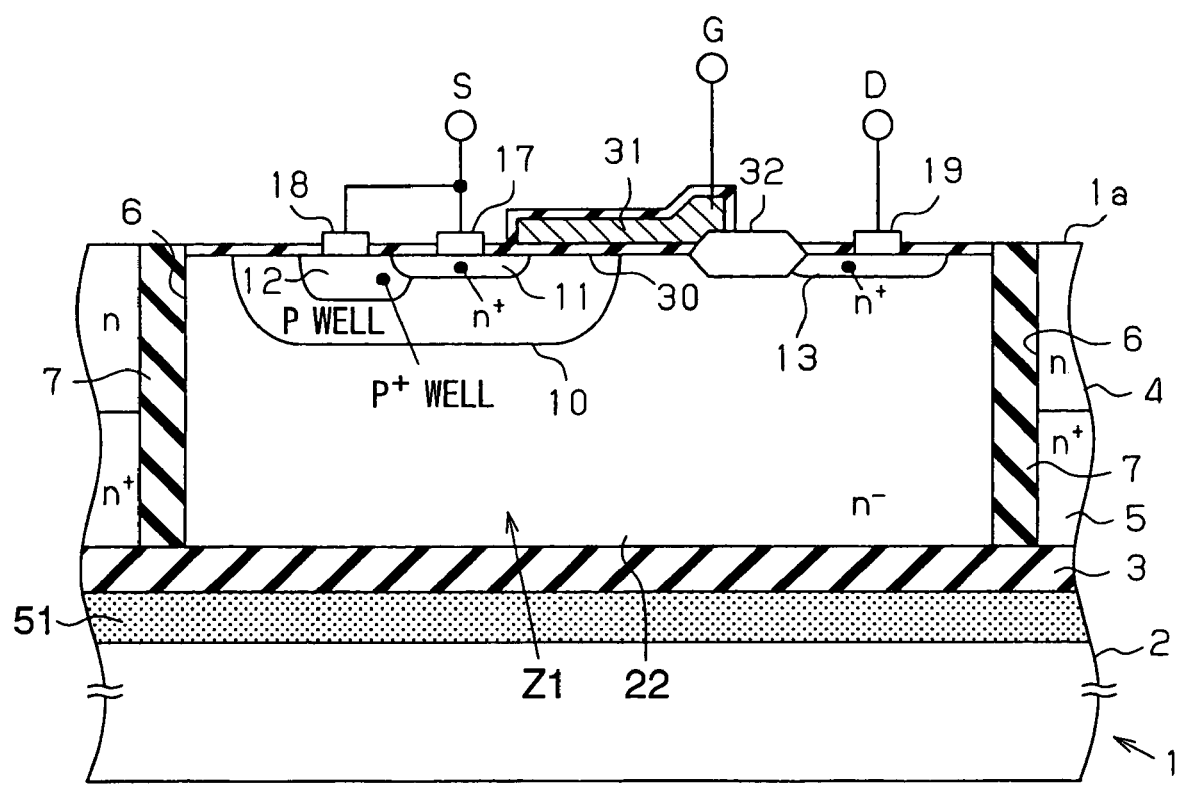
FIG. 14 is a vertical cross sectional view showing further another semiconductor device according to another modification of the second embodiment mode.

Alternatively, as shown in FIG. 14, the device may not have the offset layer 20 and the electric field relaxation well layer 21, and may have an electric potential applying layer 51. Specifically, the corner of the trench gate electrode disposed on a drain side is disposed on the N type embedded layer 22. Further, the drain region 13 is disposed in the N type embedded layer 22. The N type embedded layer 22 is disposed on the embedded oxide film 3. The electric potential applying layer 51 is disposed under the embedded oxide film 3. The electric potential of the electric potential applying layer 51 is approximately equal to the electric potential of the source potential. In this case, the drain potential does not penetrate under the trench gate electrode 16. As a result, the electric field at the corner of the trench gate electrode 16 is reduced, and therefore, the breakdown voltage of the device is improved. Here, the electric potential applying layer 51 may be made of metal or semiconductor.

Third Embodiment Mode

Next, the difference between the third embodiment mode and the second embodiment mode is mainly explained.

Figure 7:
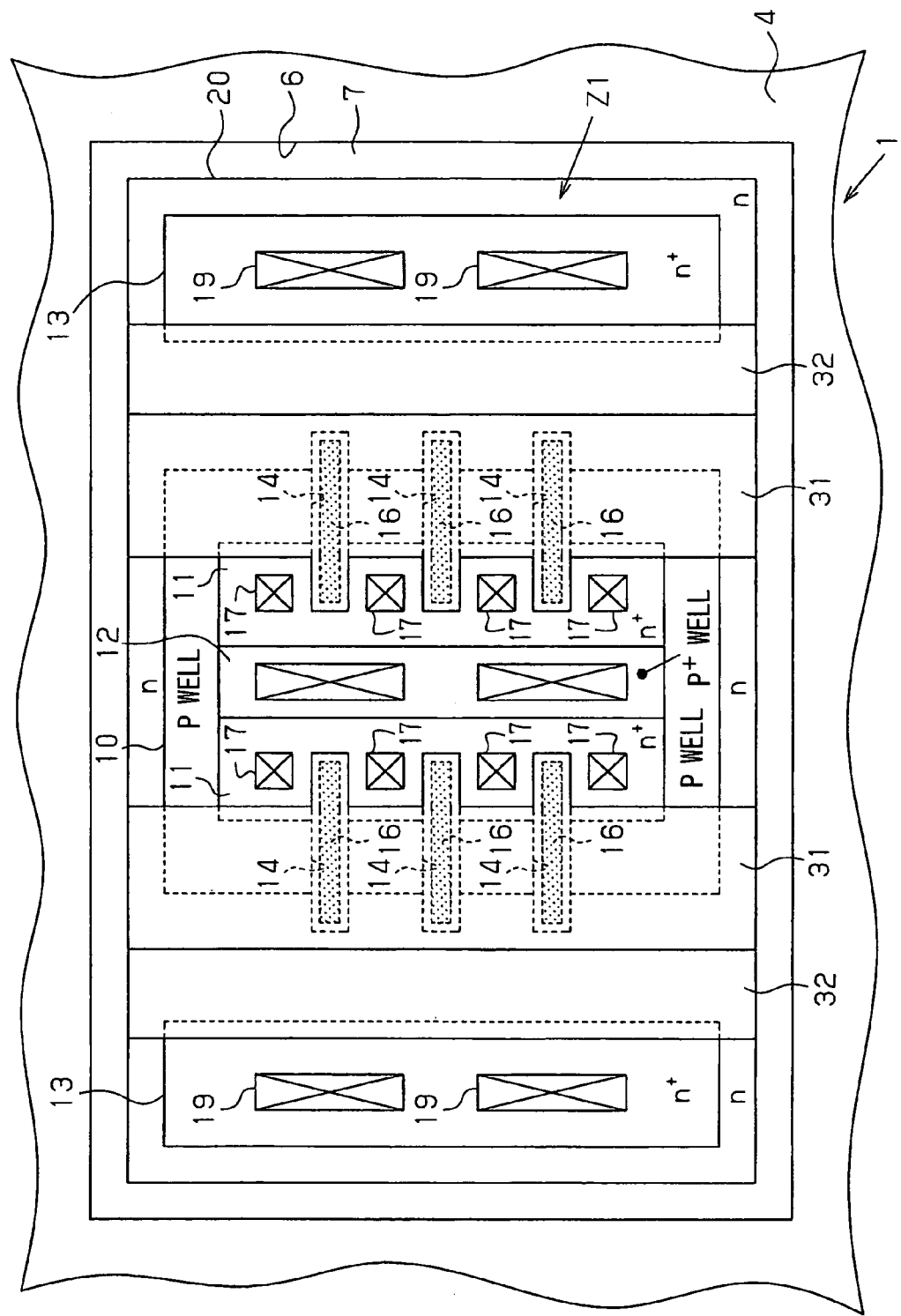
FIG. 7 is a plan view showing a semiconductor device according to a third embodiment mode.

FIG. 7 shows the plan view of a semiconductor device according to the present embodiment mode instead of FIG. 4.

In FIG. 7, the drain region 13 is formed in the region Z1 separated from other parts on both of the right side and the left side of the drawing in the right-left direction. Further, the channel forming region 10 (and the source region 11) is formed on a center portion of the drawing in the right-left direction.

Each of the drain region 13 on the right and left sides and the channel forming region 10 (and the source region 11) on the center portion has a belt shape, and further, extends in parallel to each other. Thus, each of the drain region 13 and the channel forming region 10 (and the source region 11) has a stripe shape. Further, three trenches 14 (i.e., the trench gate electrodes 16) extend toward the right side drain region 13 from the center source region 11. Further, three trenches 14 (i.e., the trench gate electrodes 16) extend toward the left side drain region 13 from the center source region 11.

Thus, multiple trench gate electrodes 16 are formed in the region Z1 separated from other parts. Thus, the area of the device is reduced. Specifically, when multiple trench gate electrodes 16 are formed in the region separated from other parts, the area of the region Z1 separated from other parts is reduced, compared with a case where one trench gate electrode 16 is formed in each region separated from other parts, when the number of the trench gate electrodes 16 is constant.

Figure 8:
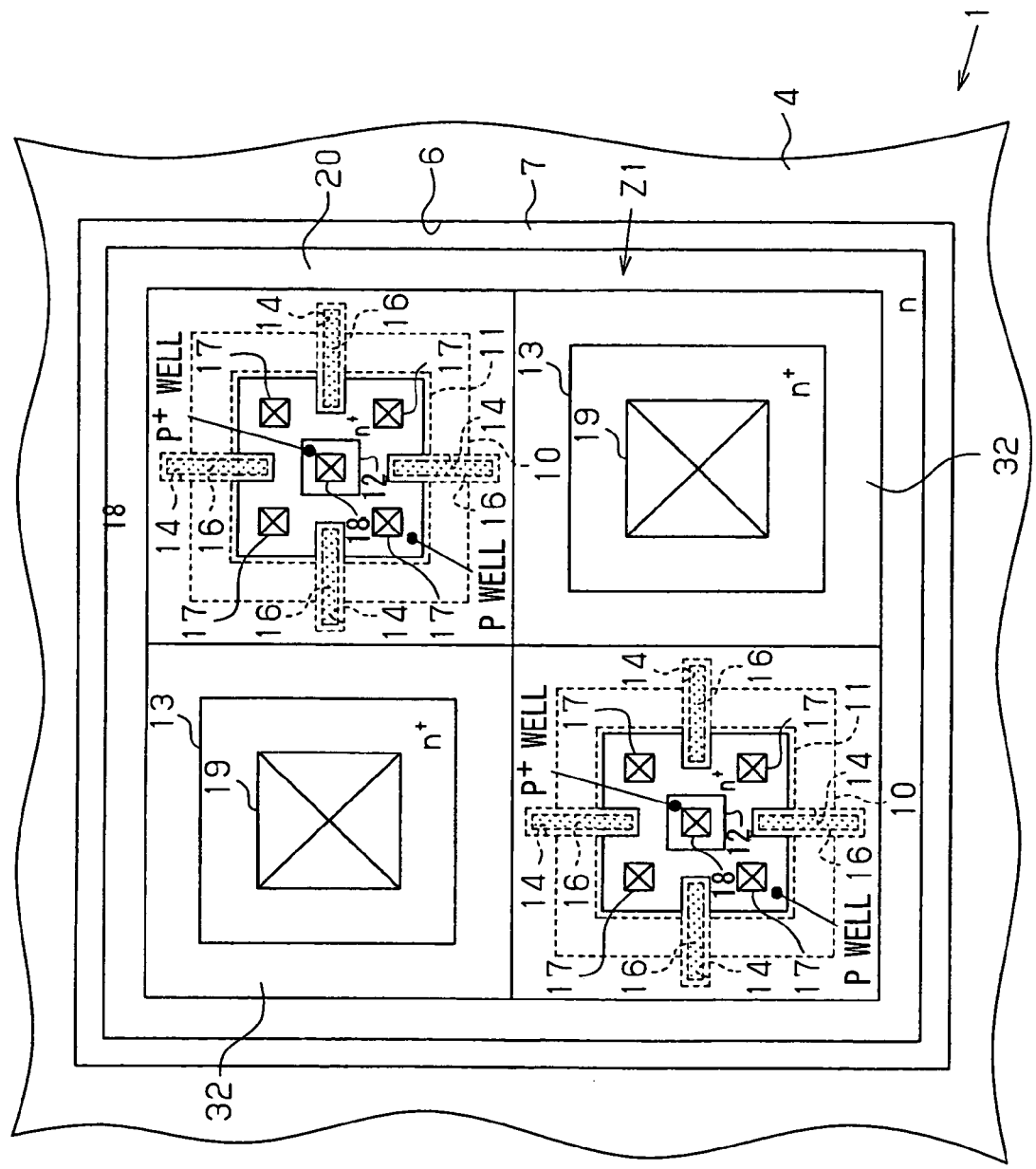
FIG. 8 is a plan view showing a semiconductor device according to a modification of the third embodiment mode.

In FIG. 7, each of the drain region 13 and the channel forming region 10 (and the source region 11) has a stripe shape. Alternatively, as shown in FIG. 8, each of the drain region 13 and the channel forming region 10 (and the source region 11) may have a mesh shape. Specifically, in FIG. 8, the drain region 13 is formed in the region Z1 separated from other parts on the upper left side and the lower right side of the drawing. Further, the channel forming region 10 (and the source region 11) is formed on the upper right side and the lower left side of the drawing. Each of the drain region 13 on the upper left side and the lower right side has a square shape, and each of the channel forming region 10 (and the source region 11) on the upper right side and the lower left side has a square shape. Thus, each of the drain region 13 and the channel forming region 10 (and the source region 11) has a mesh shape. Further, the trench 14 (i.e., the trench gate electrode 16) extends toward the drain region 13 from the source region 11.

Fourth Embodiment Mode

Next, the difference between the fourth embodiment mode and the second embodiment mode is mainly explained.

Figure 9:
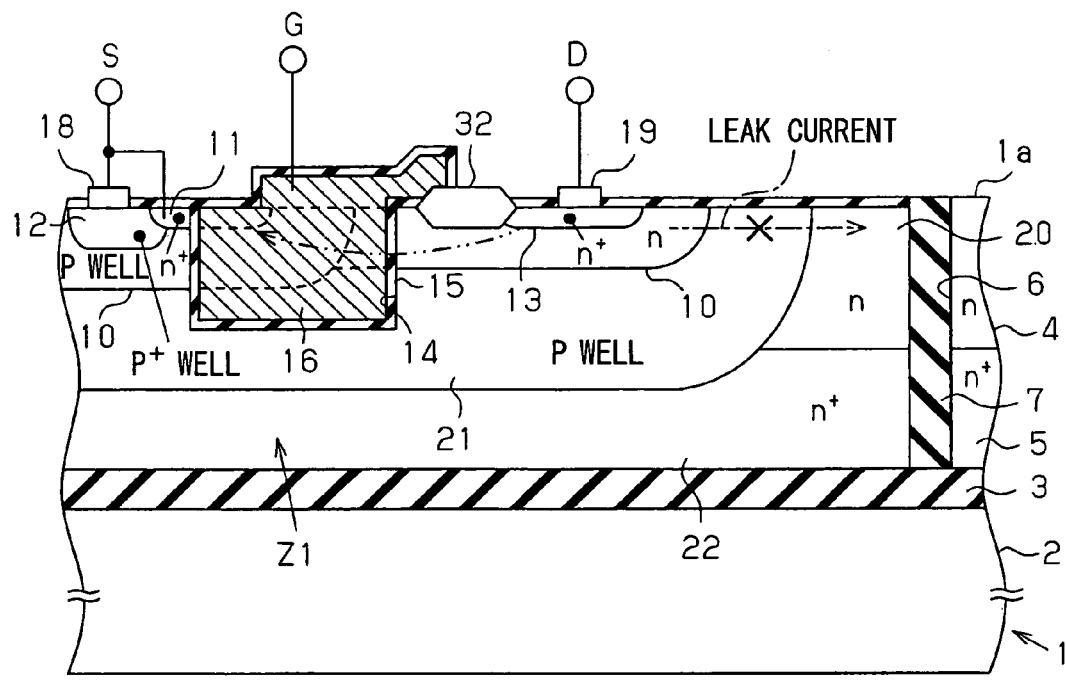
FIG. 9 is a vertical cross sectional view showing a semiconductor device according to a fourth embodiment mode.

As shown in FIG. 9, the P type electric field relaxation well layer 21 is formed not to contact the part separation trench 6. Thus, no PN junction is formed on a sidewall of the part separation trench 6. The influence of leakage is reduced.

Thus, the electric field relaxation well layer 21 does not contact the part separation trench 6, so that it is preferred that the current leakage is limited since no PN junction is disposed on the sidewall of the trench.

Fifth Embodiment Mode

Next, the difference between the fifth embodiment mode and the second embodiment mode is mainly explained.

Figure 10:
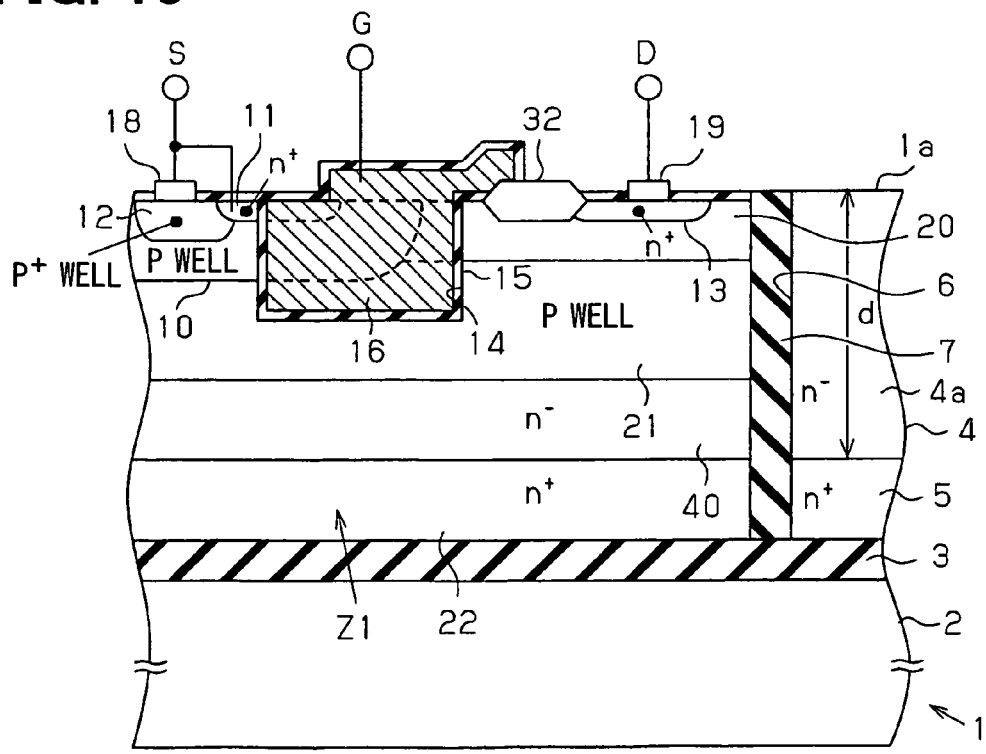
FIG. 10 is a vertical cross sectional view showing a semiconductor device according to a fifth embodiment mode.

As shown in FIG. 10, the device has a construction such that the P type electric field relaxation well layer 21 does not reach the $N^+$ type embedded layer 22. Thus, the P type electric field relaxation well layer 21 is formed on the $N^+$ type embedded layer 22 through the $N^-$ layer 40. The $N^-$ layer 40 is formed from silicon material, which is prepared before embedding the $N^+$ type embedded layer 22 in the silicon layer 4 (i.e., before the device is formed). It is preferred that the silicon layer 4 is thick, specifically, the thickness d of the $N^-$ type region 4a is thick. Thus, when the silicon layer 4 is thick, it is not necessary for the well layer 21 to reach the $N^+$ embedded layer 22.

Thus, the device has the construction such that the electric field relaxation well layer 21 does not reach the embedded layer 22, so that it is practically preferred that the region Z1 separated from other parts is thick.

Although a case where the part separation is performed by the trench is explained, the part separation may be performed by a PN junction.

Further, in the above explanation, the first conductive type is the N type, and the second conductive type is the P type, (i.e., the offset layer 20 is the N type, and the electric field relaxation well layer 21 is the P type) so that the N channel transistor is provided. Alternatively, the first conductive type may be the P type, and the second conductive type may be the N type, (i.e., the offset layer 20 may be the P type, and the electric field relaxation well layer 21 may be the N type).

The above disclosure has the following aspects.

According to an aspect of the present disclosure, a semiconductor device includes: a semiconductor substrate; a separation region disposed in the substrate, wherein the separation region is separated from other parts of the substrate; an embedded layer having a first conductive type, wherein the embedded layer is disposed on a bottom portion of the separation region, and wherein the embedded layer has an electric potential in a floating state; a channel forming region having a second conductive type, wherein the channel forming region is disposed on a surface portion of the separation region on a principal surface of the semiconductor substrate; a source region having the first conductive type, wherein the source region is disposed on a surface portion of the channel forming region; a drain region having the first conductive type, wherein the drain region is disposed on another surface portion of the separation region on the principal surface of the substrate, and wherein the drain region is separated from the channel forming region; a first electrode for applying a source voltage to the source region; a second electrode for applying the source voltage to the channel forming region; a third electrode for applying a drain voltage to the drain region; a trench disposed on the principal surface of the semiconductor substrate, wherein the trench penetrates the channel forming region between the source region and the drain region, and wherein the trench is deeper than the channel forming region; a trench gate electrode disposed on an inner surface of the trench through a gate insulation film; an offset layer having the first conductive type, wherein the offset layer is disposed on a portion of the separation region to be a current path provided by the trench gate electrode between the channel forming region and the drain region, and wherein the portion is further another surface portion of the separation region on the principal surface of the substrate; and an electric field relaxation layer having the second conductive type, wherein the electric field relaxation layer is disposed under the channel forming region and the offset layer in the separation region, and wherein the electric field relaxation layer is deeper than the trench, is connected to the channel forming region, and covers a bottom of the trench.

In the above device, when a transistor turns on, an inversion layer is formed on a portion facing the trench gate electrode, the portion disposed in the channel forming region. Thus, a current flows between the drain region and the source region through the portion (i.e., the inversion layer) in the channel forming region facing the trench gate electrode and the offset layer. On the other hand, an electric field relaxation well layer is formed under the channel forming region and the offset layer. The electric field relaxation well layer is connected to the channel forming region. Further, the electric field relaxation well layer covers the bottom of the trench. Thus, the electric field is not concentrated at the lower portion of the trench gate electrode disposed on a drain region side, so that the breakdown voltage is improved. Further, since the electric potential of the embedded layer becomes in a floating state, both of the breakdown voltage and the static electricity withstand voltage are balanced. Thus, the semiconductor device having the trench gate type lateral MOS transistor construction, in which the embedded layer is disposed in the region separated from other parts, has excellent breakdown voltage.

Alternatively, the separation region may be separated from other parts of the substrate by a part separation trench in the semiconductor substrate. In this case, the part separation can be easily performed. Further, the semiconductor substrate may be a SOI substrate having a SOI layer, an embedded oxide film and a silicon substrate, which are stacked in this order. The separation region is disposed in the SOI layer, and the separation region is surrounded with the embedded oxide film and an insulation film in the part separation trench so that the separation region is separated from other parts of the substrate.

Alternatively, the semiconductor device may further include a planar gate electrode disposed on the principal surface through a gate insulation film. In this case, the on-state resistance is reduced. Further, the planar gate electrode and the trench gate electrode may be integrated, and the planar gate electrode and the trench gate electrode provide an inversion layer in a part of the channel forming region, the part which faces the planar gate electrode and the trench gate electrode.

Alternatively, the semiconductor device may further include a LOCOS oxide film disposed on another portion to be a current path provided by the planar gate electrode, the another portion disposed in the separation region on the principal surface of the semiconductor substrate. In this case, the breakdown voltage is improved.

Alternatively, the semiconductor device may further include a plurality of trench gate electrodes disposed in the separation region. In this case, the area of the region separated from other parts is minimized, compared with a case where one trench gate electrode is formed in each region separated from other parts, when the number of the trench gate electrodes is constant.

Alternatively, each of the drain region and the channel forming region may have a stripe pattern. Alternatively, each of the drain region and the channel forming region has a mesh pattern.

Alternatively, the electric field relaxation layer may not contact the part separation trench. In this case, it is preferable for limiting current leakage. Further, the electric field relaxation layer may be separated from the part separation trench by the offset layer.

Alternatively, the electric field relaxation layer may not reach the embedded layer. In this case, it is practically preferable for a case where the region separated from other parts is thick. Further, the semiconductor device may further include a first conductive type layer disposed between the electric field relaxation layer and the embedded layer to separate the electric field relaxation layer from the embedded layer.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor substrate;
   a separation region disposed in the semiconductor substrate, wherein the separation region is separated from other parts of the semiconductor substrate;
   an embedded layer having a first conductive type, wherein the embedded layer is disposed on a bottom portion of the separation region, and wherein the embedded layer has an electric potential in a floating state;
   a channel forming region having a second conductive type, wherein the channel forming region is disposed on a surface portion of the separation region on a principal surface of the semiconductor substrate;
   a source region having the first conductive type, wherein the source region is disposed on a surface portion of the channel forming region;
   a drain region having the first conductive type, wherein the drain region is disposed on another surface portion of the separation region on the principal surface of the semiconductor substrate, and wherein the drain region is separated from the channel forming region;
   a first electrode for applying a source voltage to the source region;

a second electrode for applying the source voltage to the channel forming region;

a third electrode for applying a drain voltage to the drain region;

a trench disposed on the principal surface of the semiconductor substrate, wherein the trench penetrates the channel forming region between the source region and the drain region, and wherein the trench is deeper than the channel forming region;

a trench gate electrode disposed on an inner surface of the trench through a gate insulation film;

an offset layer having the first conductive type, wherein the offset layer is disposed on a portion of the separation region to be a current path provided by the trench gate electrode between the channel forming region and the drain region, and wherein the portion is further another surface portion of the separation region on the principal surface of the semiconductor substrate; and an electric field relaxation layer having the second conductive type, wherein the electric field relaxation layer is disposed under the channel forming region and the offset layer in the separation region, and wherein the electric field relaxation layer is deeper than the trench, is connected to the channel forming region, and covers a bottom of the trench.

2. The semiconductor device according to claim 1, wherein
the separation region is separated from other parts of the substrate by a part separation trench in the semiconductor substrate.

3. The semiconductor device according to claim 2, wherein
the semiconductor substrate is a SOI substrate having a SOI layer, an embedded oxide film and a silicon substrate, which are stacked in this order,
the separation region is disposed in the SOI layer, and
the separation region is surrounded with the embedded oxide film and an insulation film in the part separation trench so that the separation region is separated from other parts of the substrate.

4. The semiconductor device according to claim 1, further comprising:
a planar gate electrode disposed on the principal surface (1a) through a gate insulation film.

5. The semiconductor device according to claim 4, wherein
the planar gate electrode and the trench gate electrode are integrated, and
the planar gate electrode and the trench gate electrode provide an inversion layer in a part of the channel forming region, the part which faces the planar gate electrode and the trench gate electrode.

6. The semiconductor device according to claim 4, further comprising:
a LOCOS oxide film disposed on another portion to be a current path provided by the planar gate electrode, the another portion disposed in the separation region on the principal surface of the semiconductor substrate.

7. The semiconductor device according to claim 1, further comprising:
a plurality of trench gate electrodes disposed in the separation region.

8. The semiconductor device according to claim 7, wherein
each of the drain region and the channel forming region has a stripe pattern.

9. The semiconductor device according to claim 7, wherein
each of the drain region and the channel forming region has a mesh pattern.

10. The semiconductor device according to claim 2, wherein
the electric field relaxation layer does not contact the part separation trench.

11. The semiconductor device according to claim 10, wherein
the electric field relaxation layer is separated from the part separation trench by the offset layer.

12. The semiconductor device according to claim 1, wherein
the electric field relaxation layer does not reach the embedded layer.

13. The semiconductor device according to claim 12, further comprising:
a first conductive type layer disposed between the electric field relaxation layer and the embedded layer to separate the electric field relaxation layer from the embedded layer.

* * * * *